United States Patent
Shih (10) Patent No.: US 10,250,284 B2
(45) Date of Patent: Apr. 2, 2019

(54) RECEIVING CIRCUIT OF WIRELESS COMMUNICATION SYSTEM AND METHOD OF RECEIVING RF SIGNAL

(71) Applicant: REALTEK SEMICONDUCTOR CORPORATION, Hsinchu (TW)

(72) Inventor: Yi-Chang Shih, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/919,611

(22) Filed: Mar. 13, 2018

(65) Prior Publication Data

US 2018/0269913 A1    Sep. 20, 2018

(30) Foreign Application Priority Data

Mar. 14, 2017  (TW) .............................. 106108387 A (51) Int. Cl.
  *H04B 1/10* (2006.01)
  *H04B 1/26* (2006.01)
  *H03F 3/195* (2006.01)
  *H03F 1/26* (2006.01)

(52) U.S. Cl.
  CPC ................. *H04B 1/26* (2013.01); *H03F 1/26* (2013.01); *H03F 3/195* (2013.01); *H03F 2200/171* (2013.01); *H03F 2200/294* (2013.01); *H03F 2200/451* (2013.01); *H03F 2200/465* (2013.01)

(58) Field of Classification Search
  CPC .............. H04B 1/26; H03F 1/26; H03F 3/195
  USPC ....................................................... 455/219
  See application file for complete search history.

(56) References Cited

U.S. PATENT DOCUMENTS

| | | | |
|---|---|---|---|
| 6,873,832 B2 | 3/2005 | Shi | |
| 6,961,552 B2 | 11/2005 | Darabi et al. | |
| 6,980,786 B1 | 12/2005 | Groe | |
| 7,081,796 B2 | 7/2006 | Krone | |
| 7,983,642 B2 | 7/2011 | Da Graca et al. | |
| 8,718,207 B2 | 5/2014 | Chen et al. | |
| 8,812,052 B2 | 8/2014 | Xu et al. | |
| 2003/0025623 A1* | 2/2003 | Brueske | H03G 3/3052 341/139 |

FOREIGN PATENT DOCUMENTS

EP    1719243 B1    10/2009

* cited by examiner

*Primary Examiner* — Sanh D Phu
(74) *Attorney, Agent, or Firm* — WPAT, PC (57) ABSTRACT

A method of receiving an RF signal is applied to a receiving circuit of a wireless communication system and amplifies the RF signals according to an analog gain. The RF signal includes data signals and interference signals. The method includes steps of: employing a low noise amplifier (LNA) to amplify the RF signal according to a first gain to generate an amplified RF signal, the first gain being associated with a first bias signal; detecting the amplified RF signal in an RF band to generate a control signal corresponding to the power of the amplified RF signal, the control signal being an analog signal; providing the first bias signal to the LNA according to the control signal; down-converting the amplified RF signal to generate an intermediate frequency or baseband signal; and filtering the intermediate frequency or baseband signal to filter out the interference signal and thus obtain the data signal.

2 Claims, 8 Drawing Sheets

RECEIVING CIRCUIT OF WIRELESS COMMUNICATION SYSTEM AND METHOD OF RECEIVING RF SIGNAL

BACKGROUND OF THE INVENTION

1. Field of the Invention

The present invention generally relates to wireless communication, and, more particularly, to a receiving circuit of a wireless communication system and a radio frequency (RF) signal receiving method.

2. Description of Related Art

A receiving end of a wireless communication system often uses a low noise amplifier (LNA) to amplify the received radio frequency (RF) signals. The gain of the LNA is associated with the noise figure (NF) and linearity of the wireless communication system. In general, a better noise figure represents a better sensitivity of the system, while a higher linearity means the system can receive the RF signals more accurately.

When the gain of an LNA is increased, the noise figure of the system becomes better, but the linearity becomes worse; on the contrary, when the gain of the LNA is decreased, the linearity of the system becomes better, but the noise figure becomes worse. Therefore, in determining the gain of an LNA, the trade-off between the linearity and the noise figure of a wireless communication system has to be considered. In a conventional technique the gain of the LNA is controlled by feedback of digital signals in a baseband circuit. The disadvantage of this technique is that the digital control signals cannot continuously and adaptively control the gain of the LNA. For example, one of two successive discrete digital control signals may lead to low linearity of the system, which might cause signal distortion, whereas the other, despite having acceptable linearity, may result in poor noise figure, which might cause low sensitivity. Such discontinuous gain control approach hinders the communication system.

SUMMARY OF THE INVENTION

In view of the issues of the prior art, an object of the present invention is to provide a receiving circuit of a wireless communication system and a radio frequency (RF) signal receiving method to improve linearity and noise figure.

A receiving circuit of a wireless communication system is disclosed. The receiving circuit receives a RF signal and amplifies the RF signal according to an analog gain. The RF signal includes a data signal and an interference signal. The receiving circuit includes a low noise amplifier (LNA), an RF power detection circuit, an LNA bias circuit, a mixer, and a filter circuit. The LNA generates a first gain according to a first bias signal and amplifies the RF signal using the first gain to generate an amplified RF signal. The RF power detection circuit is coupled to an output of the LNA and configured to detect the amplified RF signal in an RF band to generate a control signal corresponding to the power of the amplified RF signal. The control signal is an analog signal. The LNA bias circuit is coupled to the LNA and the RF power detection circuit and configured to provide the first bias signal to the LNA according to the control signal. The mixer is coupled to the LNA and configured to down-convert the amplified RF signal to generate a down-converted radio frequency (RF) signal. The filter circuit is coupled to the mixer and configured to filter out the interference signal from the down-converted RF signal and outputs the data signal.

A receiving circuit for receiving a RF signal and amplifying the RF signal according to an analog gain is disclosed. The RF signal includes a data signal and an interference signal. The receiving circuit includes an LNA, an RF power detection circuit, a mixer, a mixer bias circuit, and a filter circuit. The LNA amplifies the RF signal using a first gain to generate an amplified RF signal. The RF power detection circuit is coupled to an output of the LNA and configured to detect the amplified RF signal in an RF band to generate a control signal corresponding to the power of the amplified RF signal. The control signal is an analog signal. The mixer is coupled to the LNA and configured to generate a second gain according to a bias signal, down-convert the amplified RF signal to a down-converted radio frequency (RF) signal according to a reference clock, and amplify the amplified RF signal or the down-converted RF signal using the second gain. The mixer bias circuit is coupled to the mixer and the RF power detection circuit and configured to provide the bias signal to the mixer according to the control signal. The filter circuit is coupled to the mixer and configured to filter out the interference signal from the down-converted RF signal and output the data signal. The analog gain is substantially proportional to the product of the first gain and the second gain.

A RF signal receiving method is disclosed. The method is applied to a receiving circuit of a wireless communication system, and an RF signal is amplified according to an analog gain. The RF signal includes a data signal and an interference signal. The method includes steps of: amplifying the RF signal according to a first gain by an LNA to generate an amplified RF signal, wherein the first gain is associated with a first bias signal; detecting the amplified RF signal in an RF band to generate a control signal corresponding to the power of the amplified RF signal, wherein the control signal is an analog signal; providing the first bias signal to the LNA according to the control signal; down-converting the amplified RF signal to generate a down-converted radio frequency (RF) signal; and filtering the down-converted RF signal to filter out the interference signal and obtain the data signal.

Another RF signal receiving method is disclosed. The method is applied to a receiving end of a wireless communication system, and an RF signal is amplified according to an analog gain. The RF signal includes a data signal and an interference signal. The method includes steps of: amplifying the RF signal according to a first gain by an LNA to generate an amplified RF signal; detecting the amplified RF signal in an RF band to generate a control signal corresponding to the power of the amplified RF signal, wherein the control signal is an analog signal; down-converting the amplified RF signal to generate a down-converted radio frequency (RF) signal; amplifying the amplified RF signal or the down-converted RF signal using a second gain associated with a bias signal; generating the bias signal according to the control signal; and filtering the down-converted RF signal to filter out the interference signal and obtain the data signal. The analog gain is substantially proportional to the product of the first gain and the second gain.

The receiving circuit of a wireless communication system and the RF signal receiving method of the present invention can adaptively and continuously adjust the gain. Compared with the conventional technology, the present invention can continuously adjust the gain; therefore, the RF signals can be received in a manner that the process is more suitably adapted to the current operating environment.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a receiving circuit of a wireless communication system and a radio frequency (RF) signal receiving method. On account of that some or all elements of the receiving circuit could be known, the detail of such elements is omitted provided that such detail has little to do with the features of this disclosure and this omission nowhere dissatisfies the specification and enablement requirements. Some or all of the processes of the RF signal receiving method may be implemented by software and/or firmware, and can be performed by the receiving circuit or its equivalent. People of ordinary skill in the art can choose components or steps equivalent to those described in this specification to carry out the present invention, which means that the scope of this invention is not limited to the embodiments in the specification.

Figure 1:
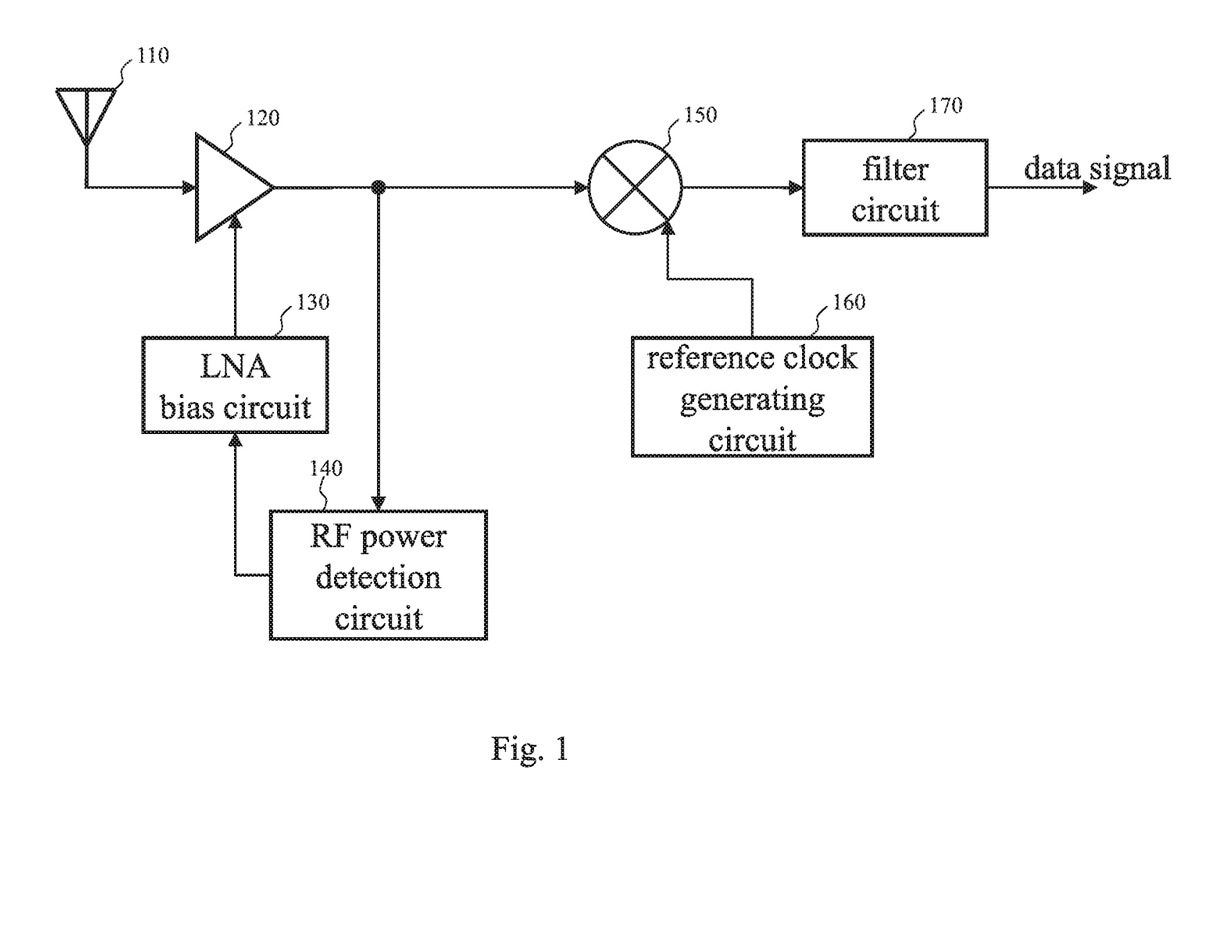
FIG. 1 illustrates a functional block diagram of a receiving circuit of a wireless communication system according to an embodiment of the present invention.

FIG. 1 is a functional block diagram of a receiving circuit of a wireless communication system according to an embodiment of the present invention. The low noise amplifier (LNA) 120 receives the RF signals through the antenna 110. The RF signals include interference signals and data signals carrying information. The LNA 120 amplifies the RF signals according to a gain, and accordingly generates amplified RF signals. The mixer 150 down-converts the amplified RF signals according to the reference clock outputted by the reference clock generating circuit 160 and generates corresponding down-converted RF signals. The down-converted RF signals may be intermediate frequency (IF) signals or baseband signals. The filter circuit 170 filters out the interference signals in the down-converted RF signals to generate the data signals that the system expects to receive. The data signals are then converted into the digital domain via a post circuit (not shown), and processes like demodulation and decoding are performed on the data signals in the digital domain. The reference clock generating circuit 160 may be, for example, implemented by an RF frequency synthesizer, but is not limited thereto.

The RF power detection circuit 140, coupled to the output of the LNA 120, detects the power of the RF signal outputted by the LNA 120 and generates an analog control signal (e.g., a voltage signal or a current signal) corresponding to the power. The LNA bias circuit 130 biases the LNA 120 according to the control signal to adaptively adjust the gain of the LNA 120. Since the control signal for controlling the LNA bias circuit 130 is an analog signal, the present invention can continuously adjust the gain of the LNA 120 according to the power of the RF signal. The output of the LNA bias circuit 130 is also an analog voltage or current signal.

When the RF power detection circuit 140 is coupled to the output of the mixer 150 rather than the output of the LNA 120, the RF power detection circuit 140 detects the power of the down-converted RF signal, rather than the power of the RF signal. The control signal generated in this circuit configuration is still an analog signal, meaning that the control of the gain value of the LNA 120 is still continuous. As opposed to the case of measuring the power of the RF signals, the system's response time for gain adjustment is longer in the case of measuring the power of the down-converted RF signal because the frequencies of the down-converted RF signals are lower than RF signals. Furthermore, when the RF power detection circuit 140 is coupled to the output of the mixer 150, the operation of the RF power detection circuit 140 is more likely affected by the parasitic capacitor(s) of the filter circuit 170. Large parasitic capacitor(s) can also slow down the system's response time for gain adjustment; however, increasing the current to shorten the response time may cause the system to be less energy efficient. Therefore, by detecting the power of the RF signals instead of the power of the down-converted RF signals, the receiving end of the wireless communication system has better circuit performance. The mixer 150 may be, for example, implemented by a passive mixer and does not have the function of signal amplification.

Figure 2:
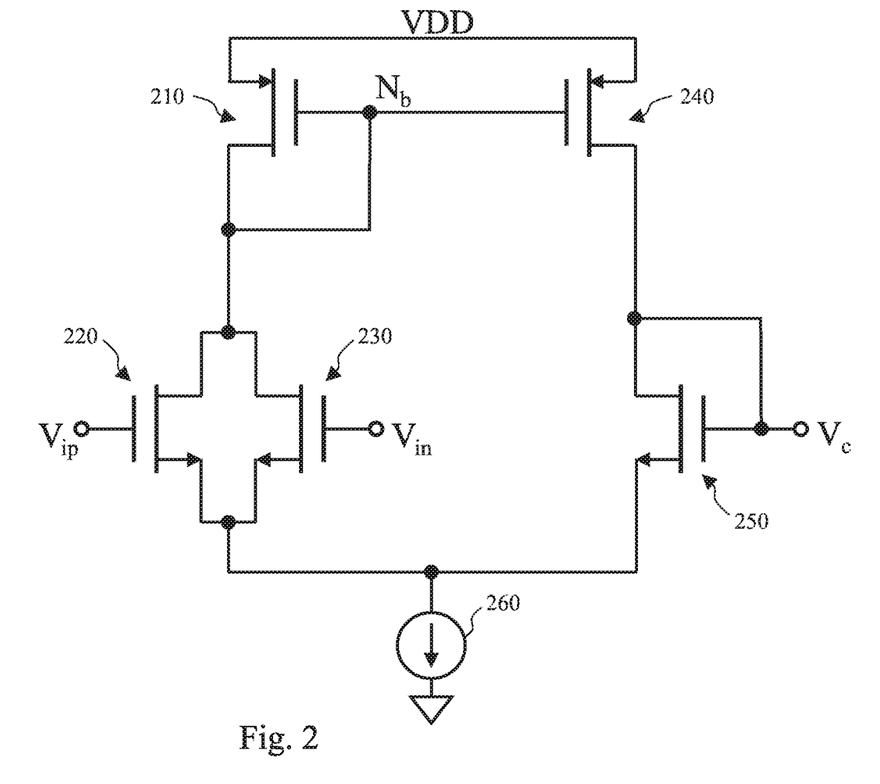
FIG. 2 illustrates a circuit diagram of the RF power detection circuit 140 according to an embodiment of the invention.

FIG. 2 is a circuit diagram of the RF power detection circuit 140 according to an embodiment of the invention. The RF power detection circuit 140 includes a current source 260 and five transistors 210-250. The transistors 210-250 may be, for example, implemented by metal-oxide-semiconductor field-effect transistors (MOSFETs). The gates of the transistors 220 and 230 receive an RF signal $V_i$. The RF signal $V_i$ may be a differential signal, as represented by differential signal pairs $V_{in}$ and $V_{ip}$ in the figure; alternatively, the RF power detection circuit 140 of the present invention can also be applied to non-differential signals in other embodiments. A larger $V_i$ causes the conduction currents of the transistors 220 and 230 to increase; as a result, the current passing through the transistor 210 (used here as a resistor) also increases, which in turn causes the voltage at the node $N_b$ to drop and therefore causes the conduction current of the transistor 240 to increase. When the current passing through the transistor 250 (used here as a resistor) increases, the voltage of the control signal $V_c$ outputted by the RF power detection circuit 140 also increases.

Figure 3:
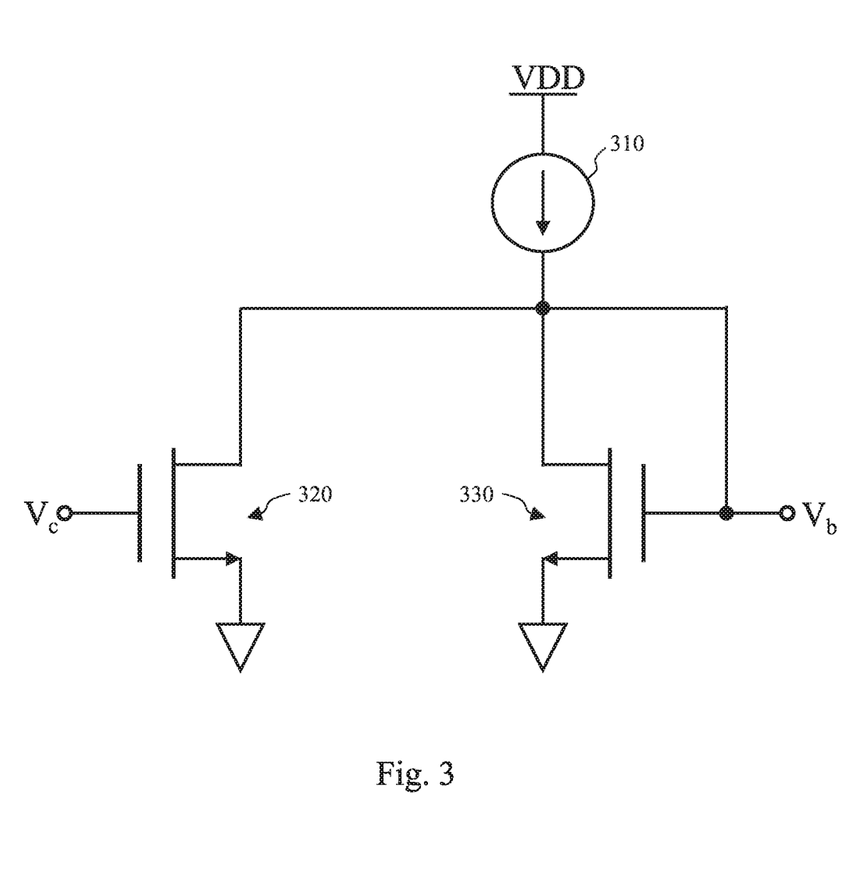
FIG. 3 illustrates a circuit diagram of the LNA bias circuit 130 according to an embodiment of the invention.

FIG. 3 is a circuit diagram of the LNA bias circuit 130 according to an embodiment of the invention. The LNA bias circuit 130 includes a current source 310 and two transistors 320 and 330. When the voltage of the control signal $V_c$ increases, the current passing through the transistor 320 increases, which in turn causes the current passing through the transistor 330 (used here as a resistor) to decrease; as a result, the bias voltage $V_b$ outputted by the LNA bias circuit 130 decreases.

Figure 4:
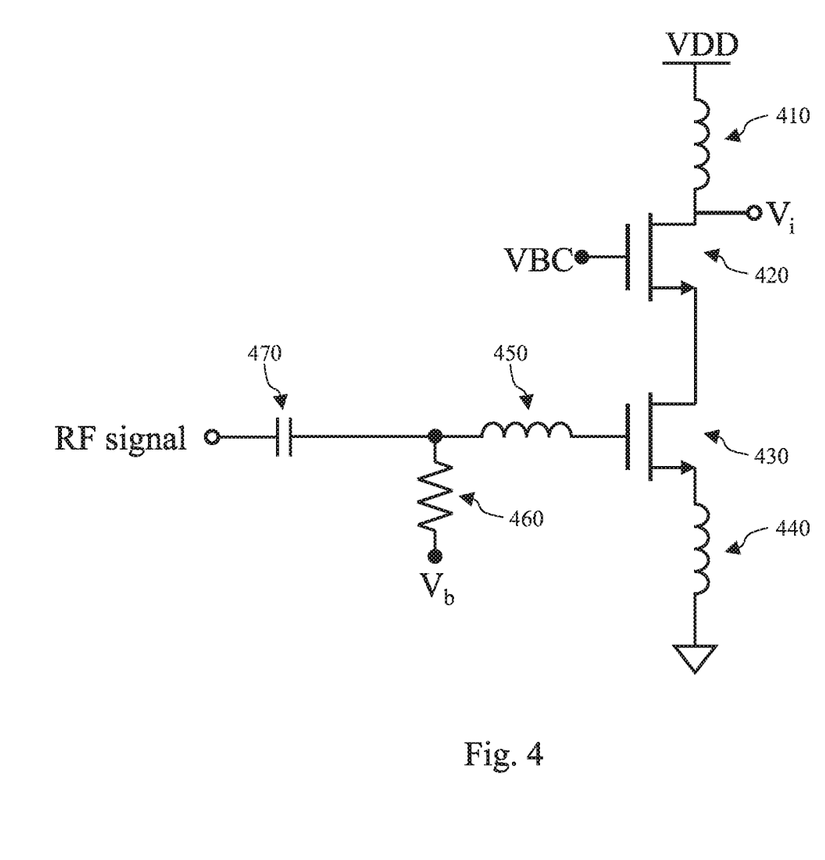
FIG. 4 illustrates a circuit diagram of the LNA 120 according to an embodiment of this invention.

FIG. 4 is a circuit diagram of the LNA 120 according to an embodiment of this invention. The serially-connected transistors 420 and 430 are connected to the high potential VDD and the low potential (e.g., ground) of the system respectively through inductors 410 and 440. The gate of the transistor 420 is coupled to the bias voltage VBC. The RF signal is coupled to the gate of the transistor 430 via the capacitor 470 and the inductor 450. The output of the LNA bias circuit 130 (i.e., the bias voltage $V_b$) is coupled to the gate of the transistor 430 through the resistor 460 and the inductor 450. When the gate-source bias of the transistor 430, which is controlled by the bias voltage $V_b$ in this embodiment, drops, the transconductance gm of the transistor 430 decreases and the gain of the LNA 120 decreases. On the contrary, as the bias voltage $V_b$ increases, the transconductance gm of the transistor 430 increases, causing the gain of the LNA 120 to increase.

Figure 5:
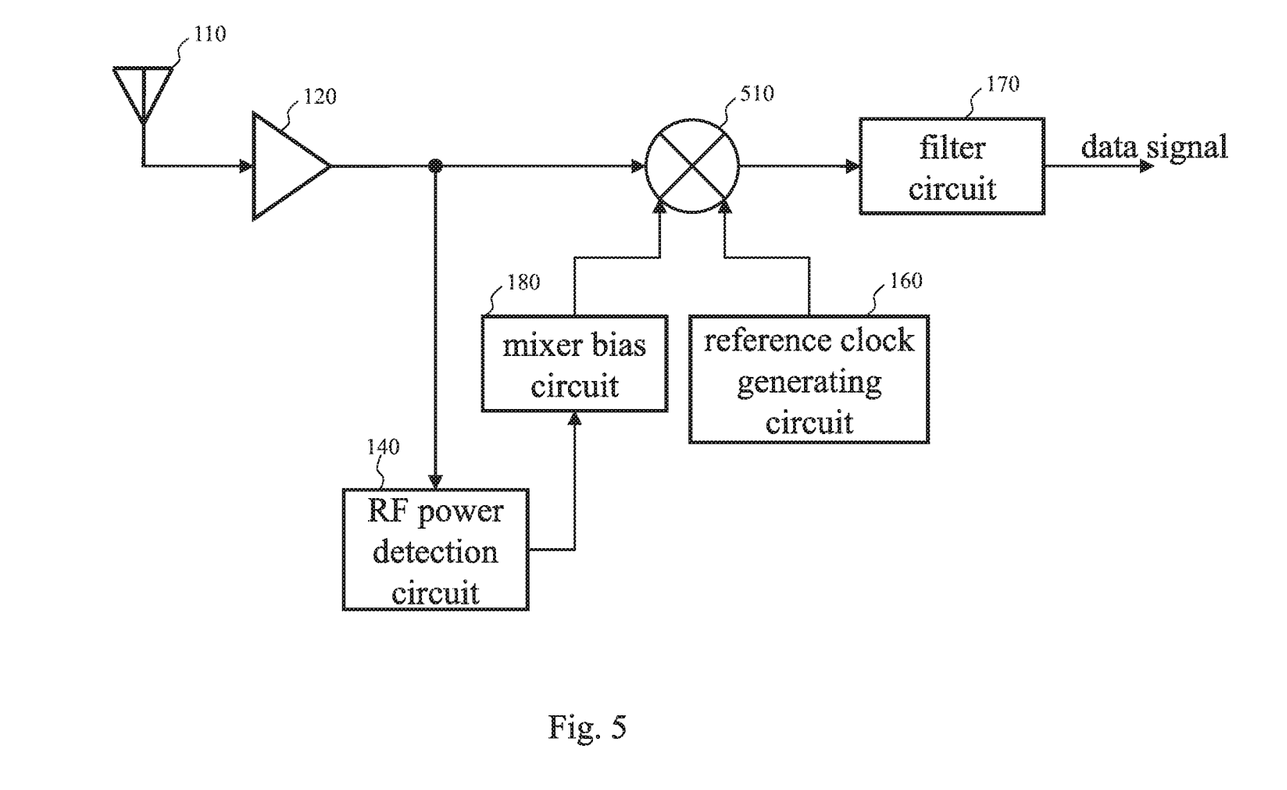
FIG. 5 illustrates a functional block diagram of a receiving circuit of a wireless communication system according to another embodiment of the present invention.

FIG. 5 is a functional block diagram of a receiving circuit of a wireless communication system according to another embodiment of the present invention. The mixer 510 can be an active mixer or a combination of a passive mixer and a transimpedance amplifier (TIA). The mixer 510 amplifies the signals according to a gain. In the case where the mixer 510 is implemented by the combination of the passive mixer and the TIA, the gain is provided by the TIA. More specifically, the main function of the mixer 510 is to down-convert the RF signal outputted by the LNA 120 to generate a down-converted RF signal; another function of the mixer 510 is to amplify the signals, such as the RF signals or the down-converted RF signals. The gain of the mixer 510 is controlled by the mixer bias circuit 180. One embodiment of the mixer bias circuit 180 is shown in FIG. 3; this circuit adjusts the magnitude of the bias voltage $V_b$ according to the control signal $V_c$ outputted by the RF power detection circuit 140 to change the gain of the mixer 510. Compared with the embodiment of FIG. 1, adjusting the gain of the mixer 510 according to the power of the RF signal can also allow the RF front-end to obtain adaptive and continuous adjustments of the equivalent gain in the analog domain (hereinafter referred to as the analog gain). The analog gain is proportional to the product of the gain of the LNA 120 and the gain of the mixer 510. In this embodiment, the gain of the LNA 120 is not adjustable or, alternatively, the gain of the LNA 120 is adjustable but is not adaptively and continuously adjusted according to the power of the RF signal.

Figure 6:
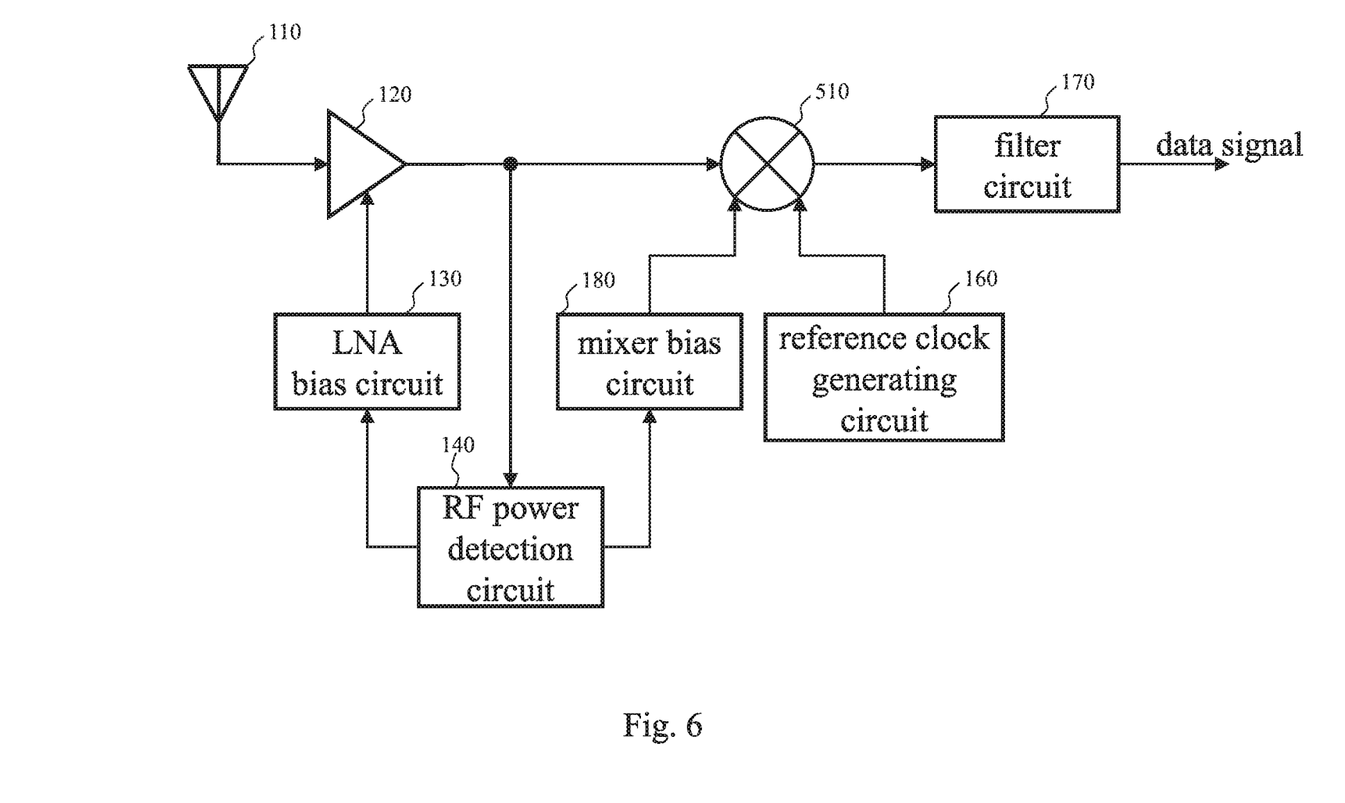
FIG. 6 illustrates a functional block diagram of a receiving circuit of a wireless communication system according to another embodiment of the present invention.

FIG. 6 is a functional block diagram of a receiving circuit of a wireless communication system according to another embodiment of the present invention. In this embodiment, both the gain of the LNA 120 and the gain of the mixer 510 are adaptively and continuously adjusted according to the power of the RF signal. Therefore, the linearity and the noise figure of the wireless communication system can be further improved.

Figure 7:
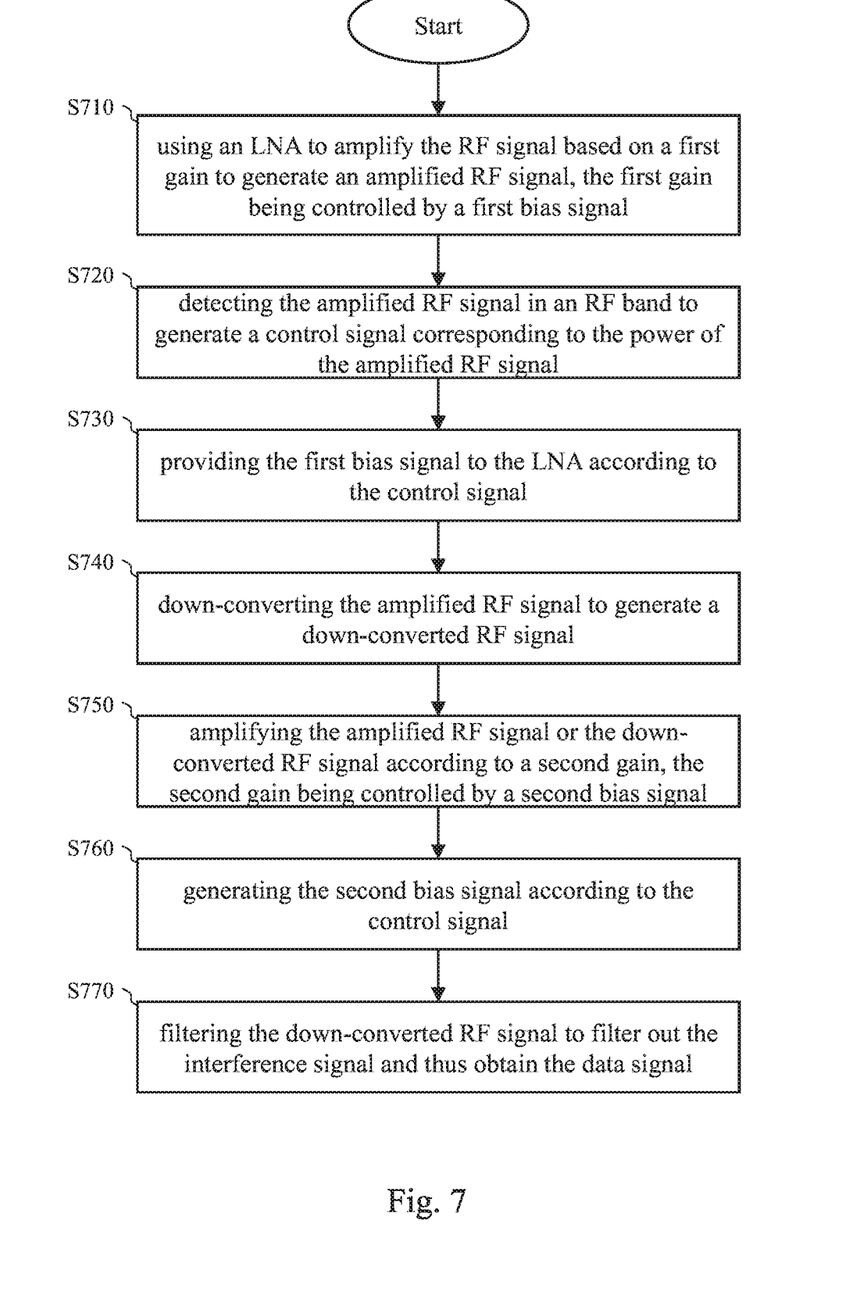
FIG. 7 illustrates a flowchart of an RF signal receiving method according to an embodiment of the invention.

In addition to the foregoing receiving circuit of a wireless communication system, the present invention also correspondingly discloses an RF signal receiving method applied to the receiving end of a wireless communication system for adaptively and continuously adjusting the gain. This method may be performed by the foregoing receiving circuit of the wireless communication system or its equivalents. The RF signal receiving method amplifies the RF signal in an analog domain based on an analog gain, and continuously and adaptively adjusts the analog gain in the analog domain. The RF signals include data signals and interference signals. FIG. 7 is a flowchart of the method according to an embodiment of the invention. The method includes the following steps:

In step S710, an LNA is used for amplifying the RF signal based on a first gain to generate an amplified RF signal. The first gain is controlled by a first bias signal.

In step S720, the amplified RF signal is detected in an RF band to generate a control signal corresponding to the power of the amplified RF signal. This step directly detects the power of the output signal of the LNA instead of detecting the down-converted signal; therefore, this step is performed in the RF band instead of in the lower frequency IF band or baseband. As opposed to detecting the signal power in the IF band or baseband, this step enables more immediately obtaining a power detection result. The control signal is an analog signal.

In step S730, the first bias signal is provided to the LNA according to the control signal. The first bias signal is generated according to the control signal. For example, the first bias signal may be directly proportional or inversely proportional to the power of the amplified RF signal in an indirect manner. The first bias signal is also an analog signal.

In step S740, the amplified RF signal is down-converted to generate a down-converted RF signal. This step may, for example, perform the down-conversion operation based on the operating principles of a mixer. The down-converted RF signal may be an intermediate frequency (IF) signal or a baseband signal.

In step S750, the amplified RF signal or the down-converted RF signal is amplified according to a second gain. In addition to being amplified in the LNA, the RF signal may be optionally amplified again elsewhere in the analog circuit. The second gain is controlled by a second bias signal.

In step S760, the second bias signal is generated according to the control signal. For example, the second bias signal may be directly proportional or inversely proportional to the power of the amplified RF signal in an indirect manner. The second bias signal is also an analog signal.

In step S770, the down-converted RF signal is filtered to filter out the interference signal and thus obtain the data signal.

Steps S750 and S760 are optional. That is, in the process of amplification of the RF signal by the LNA to the completion of the filtering operation, the RF signal may be amplified once (i.e., steps S750 and S760 are skipped) or twice (i.e., steps S750 and S760 are performed). In the case where the RF signal is amplified once, the analog gain experienced by the RF signal is proportional to the first gain; in the case where the RF signal is amplified twice, the analog gain is proportional to the product of the first gain and the second gain. In other words, the analog gain is continuously and adaptively adjusted according to the power of the RF signal. Therefore, it is possible to obtain a gain more suitable for the current operating environment so that the linearity and the noise figure can be better balanced.

Figure 8:
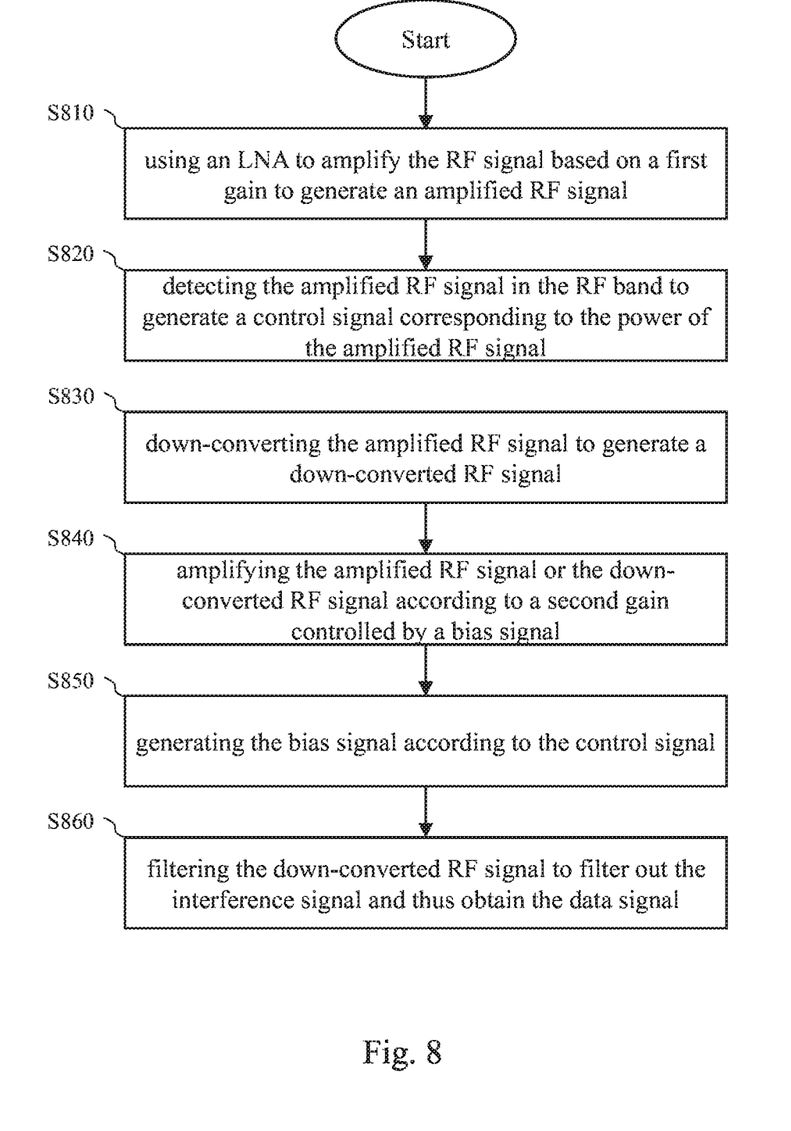
FIG. 8 illustrates a flowchart of an RF signal receiving method according to another embodiment of the invention.

According to another embodiment of the invention, FIG. 8 shows a flowchart of a method for receiving a RF signal. The method includes the following steps:

In step S810, an LNA is used for amplifying the RF signal based on a first gain to generate an amplified RF signal. The first gain is not adjusted in accordance with the power of the RF signal. For example, the first gain may be a constant value.

In step S820, the amplified RF signal is detected in the RF band to generate a control signal corresponding to the power of the amplified RF signal. This step is similar to step S720, and likewise, the control signal is an analog signal.

In step S830, the amplified RF signal is down-converted to generate a down-converted RF signal. This step is similar to step S740 and the descriptions are thus omitted for brevity.

In step S840, the amplified RF signal or the down-converted RF signal is amplified according to a second gain. The second gain is controlled by a bias signal. The bias signal is also an analog signal.

In step S850, the bias signal is generated according to the control signal. For example, the bias signal may be directly proportional or inversely proportional to the power of the amplified RF signal in an indirect manner. The bias signal is also an analog signal.

In step S860, the down-converted RF signal is filtered to filter out the interference signal and thus obtain the data signal.

Although the method described in FIG. 8 does not adjust the gain according to the power of the RF signal in the LNA, the gain may still be adjusted according to the power of the RF signal in other operation phases (for example, after the frequency down-conversion). Therefore, the overall analog gain is still adjusted according to the power of the RF signal. In addition, since the control signal and the bias signal are analog signals, the gain adjustment is continuous and adaptive. The analog gain is substantially proportional to the product of the first gain and the second gain.

The present invention may be applied to the receiving ends of the communications systems including, but not limited to, wireless networks (including but not limited to WiFi), Bluetooth, global positioning system (GPS), frequency modulation (FM), and mobile communication (e.g., GSM, 3G, LTE).

Since people of ordinary skill in the art can appreciate the implementation detail and the modification thereto of the present method inventions of FIG. 7 and FIG. 8 through the disclosure of the device inventions of FIG. 1 to FIG. 6, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A receiving circuit of a wireless communication system, the receiving circuit configured to receive a radio frequency (RF) signal including a data signal and an interference signal and amplify the RF signal according to an analog gain, the receiving circuit comprising:
    a low noise amplifier (LNA) configured to generate a first gain according to a first bias signal and amplifying the RF signal using the first gain to generate an amplified RF signal;
    an RF power detection circuit coupled to an output of the LNA and configured to detect the amplified RF signal in an RF band to generate a control signal corresponding to the power of the amplified RF signal, the control signal being an analog signal;
    an LNA bias circuit coupled to the LNA and the RF power detection circuit and configured to provide the first bias signal to the LNA according to the control signal;
    a mixer coupled to the LNA and configured to down-convert the amplified RF signal to generate a down-converted radio frequency (RF) signal; and
    a filter circuit coupled to the mixer and configured to filter out the interference signal from the down-converted RF signal and output the data signal;
    wherein the mixer is a passive mixer without signal amplifying functions, and the analog gain is substantially proportional to the first gain.

2. The receiving circuit of claim 1, wherein the down-converted RF signal is one of an intermediate frequency (IF) signal and a baseband signal.

* * * * *